United States Patent
Kim

(10) Patent No.: US 7,166,526 B2
(45) Date of Patent: Jan. 23, 2007

(54) METHOD FOR FORMING SILICIDE FILM IN SEMICONDUCTOR DEVICE

(75) Inventor: In Su Kim, Chungcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 58 days.

(21) Appl. No.: 11/027,141

(22) Filed: Dec. 28, 2004

(65) Prior Publication Data
US 2005/0142826 A1    Jun. 30, 2005

(30) Foreign Application Priority Data
Dec. 30, 2003    (KR) .................... 10-2003-0099527

(51) Int. Cl.
*H01L 21/3205* (2006.01)
*H01L 21/4763* (2006.01)
*H01L 21/44* (2006.01)

(52) U.S. Cl. .................... 438/589; 438/592; 438/597

(58) Field of Classification Search ............ 438/592, 438/589, 597, 586, 453, 664, 584, 714, 723, 438/724; 257/E21.645, E21.165
See application file for complete search history.

(56) References Cited

U.S. PATENT DOCUMENTS

| | | | | |
|---|---|---|---|---|
| 6,015,748 A | * | 1/2000 | Kim et al. | 438/592 |
| 6,162,675 A | * | 12/2000 | Hwang et al. | 438/241 |
| 6,171,942 B1 | * | 1/2001 | Lee et al. | 438/596 |
| 6,828,634 B1 | * | 12/2004 | Oshima | 257/369 |
| 6,897,159 B1 | * | 5/2005 | Lee et al. | 438/714 |

* cited by examiner

*Primary Examiner*—Walter L. Lindsay, Jr.
(74) *Attorney, Agent, or Firm*—Andrew D. Fortney

(57) ABSTRACT

Method for forming a silicide film in a semiconductor device, including the steps of forming a silicide suppressing film on a silicon substrate, patterning the silicide suppressing film by chemical dry etching, forming a metal film on an entire surface of the silicon substrate inclusive of the silicide suppressing film pattern, performing a heat treatment to form a silicide film on a portion of the silicon substrate opened from the silicide suppressing film pattern, and removing a portion of the metal film not turned into the silicide, thereby forming the silicide suppressing film pattern accurately and minimizing etch damage caused by plasma, to improve process yield of the semiconductor device, substantially.

20 Claims, 8 Drawing Sheets

Realted Art dry/wet etching chemical dry etching

METHOD FOR FORMING SILICIDE FILM IN SEMICONDUCTOR DEVICE

CROSS-REFERENCE TO RELATED APPLICATIONS

This application claims the benefit of Korean Application No. P2003-99527 filed on Dec. 30, 2003, which is hereby incorporated by reference as if fully set forth herein.

BACKGROUND OF THE INVENTION

1. Field of the Invention

The present invention relates to methods for fabricating a semiconductor device, and more particularly, to a method for forming a silicide film in a semiconductor device, which can prevent a silicide reaction from occurring in a region where the silicide is not formed.

2. Discussion of the Related Art

Presently, as degrees of semiconductor device concentration increases, a sheet resistance of wiring increases due to decrease of width of the wiring. The increase of the sheet resistance of the wiring delays a signal transmission time period of a device in an integrated circuit. For preventing this, a refractory silicide which has low resistivity, and is stable at a high temperature is added to connections, not only to a gate electrode, but also to source/drain, to drop the sheet resistance and contact resistance of the wiring. Such a silicide includes a rare earth metal reactive with silicon. Such silicides include tungsten silicide ($WSi_2$), titanium silicide ($TiSi_2$), cobalt silicide ($CoSi_2$), and so on.

FIG. 1 illustrates a flow chart showing the steps of a related art method for forming a silicide film in a semiconductor device, and FIGS. 2A~2E illustrate sections showing the steps of a related art method for forming a silicide film in a semiconductor device, referring to which the related art method for forming a silicide film in a semiconductor device will be described.

Referring to FIG. 2A, after a semiconductor device fabricating process is performed on a silicon substrate 10 as a semiconductor substrate, a silicon oxide $SiO_2$ film, or a silicon nitride $Si_3N_4$ film is formed as a silicide suppression film 12 on the silicon substrate 10 for defining a region for forming a silicide film thereon. (S10)

A photo process is performed, to form a photoresist pattern 14 on the silicide suppression film 12.

Referring to FIG. 2B, the silicide suppression film exposed from the photoresist pattern 14 is subjected to dry or wet patterning, to form a silicide suppression film pattern 12a. The silicide suppression film pattern 12a serves to suppress a silicide reaction from occurring between the silicon substrate and a metal in a silicide forming step later. (S20)

Referring to FIG. 2C, a rare earth metal film 16 of, such as tungsten W, titanium Ti, cobalt Co, or so on is deposited on surfaces of the silicide suppression pattern 12a, and the silicon substrate 10, for forming a silicide. (S30)

Then, referring to FIG. 2D, a heat treatment process is performed for making a silicide reaction between the metal film 16 and the silicon substrate 10, so that a silicide film 18 is formed on a silicon substrate 10 region exposed from the silicide suppression pattern 12a, excluding the silicide suppression pattern 12a. (S40) That is, since the silicon oxide film, or the silicon nitride film, or the like of the silicide suppression film pattern 12a does not make reaction with the metal film 16 well, though the silicon oxide film, or the silicon nitride film is not turned into a silicide film, since the silicon of the silicon substrate 10 makes reaction with the metal film 16 well, the silicon is turned into a silicide film. The silicide film 18 may be formed of, for example, tungsten silicide $WSi_2$, titanium silicide $TiSi_2$, cobalt silicide $CoSi_2$, and so on.

Then, referring to FIG. 2E, upon removal of the metal film 16 which is not turned into a silicide film, excluding the silicide film 18, the silicide film 18 and the silicide suppression film pattern 12a are remained on the silicon film 10 (S50). Thereafter, the silicide suppression film pattern 12a is removed as required.

Therefore, by forming the silicide film on a region of the semiconductor device by the related art method for forming a silicide film, the sheet resistance or the contact resistance of a region having the silicide film formed thereon can be dropped.

However, with regard to the silicide suppression film pattern 12a on only an opened selected region of which the silicide film is formed by the related art method for forming a silicide, the silicide suppression film pattern 12a is subjected to dry or wet patterning.

However, it is difficult to etch the silicide suppression film pattern 12a into a desired pattern shape accurately by the isotropic etching of the wet etching. Moreover, though the dry etching, mostly by using plasma, enables accurate etching of the silicide suppression film pattern 12a because a plasma generating chamber and an etching chamber are within the same chamber, the photoresist pattern deforms because the plasma generation and the etching occur within one chamber, to require an oxygen ashing additionally for removing a deformed photoresist pattern, which is cumbersome.

SUMMARY OF THE INVENTION

Accordingly, the present invention is directed to a method for forming a silicide film in a semiconductor device that substantially obviates one or more problems due to limitations and disadvantages of the related art.

An object of the present invention is to provide a method for forming a silicide film in a semiconductor device, in which a dry etching process (such as chemical dry etching, or CDE) is performed in formation of a silicide suppression film pattern, for obtaining an accurate pattern, and minimizing etching damage from plasma, to improve yield of a semiconductor device process.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for forming a silicide film in a semiconductor device, includes the steps of forming a silicide suppressing film on a silicon substrate, patterning the silicide suppressing film by dry etching, forming a metal film on an entire surface of the silicon substrate inclusive of the silicide suppressing film pattern, performing a heat treatment to form a silicide film on a portion of the silicon substrate opened from the silicide suppressing film pattern, and removing a portion of the metal film not turned into the silicide.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
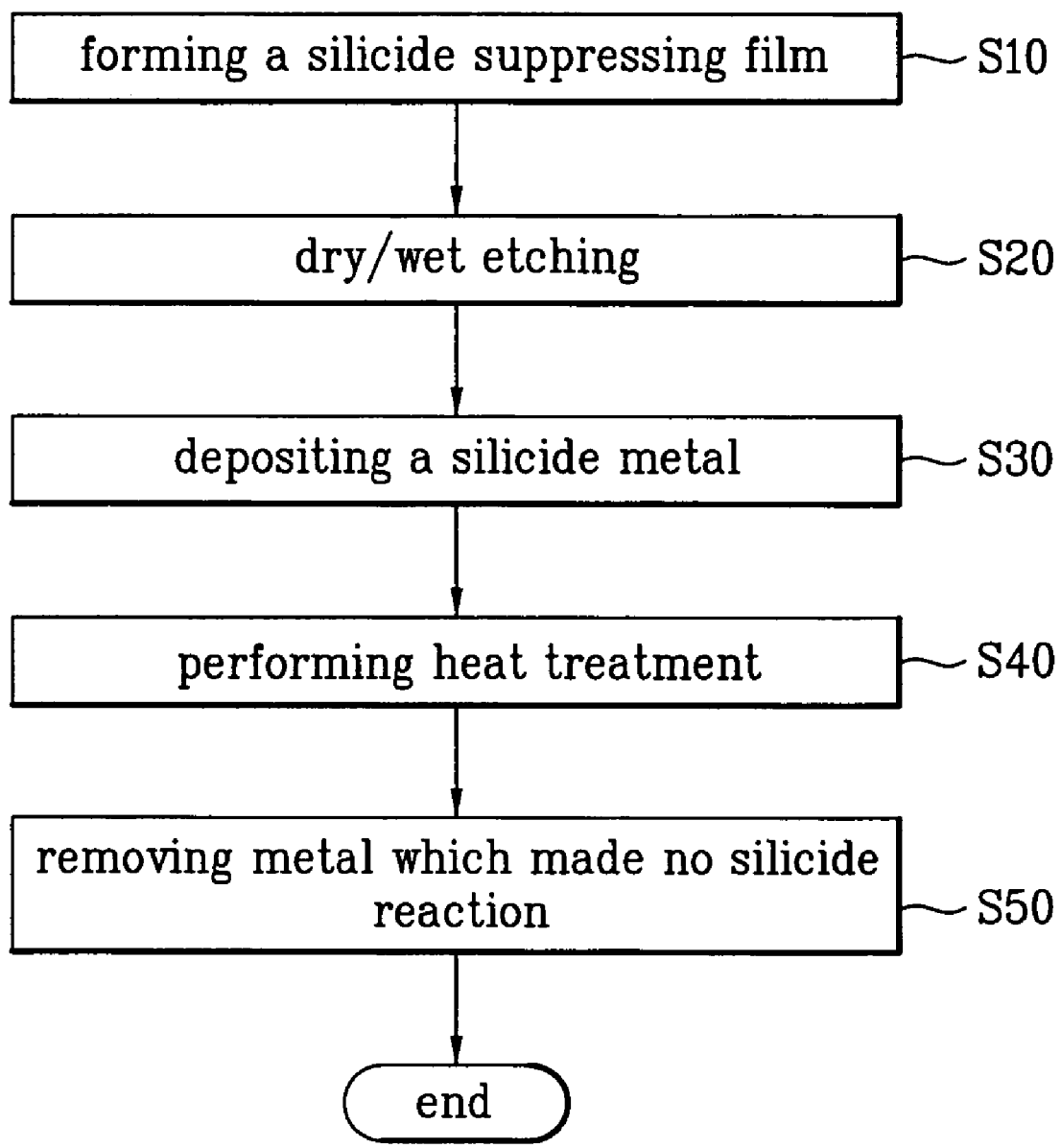
FIG. 1 illustrates a flow chart showing the steps of a related art method for forming a silicide film in a semiconductor device.
Figure 2A:
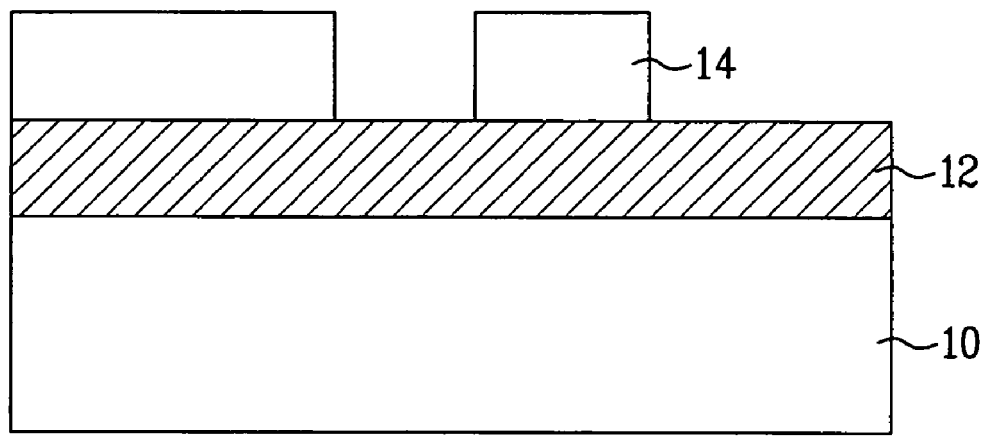
FIGS. 2A~2E illustrate sections showing the steps of a related art method for forming a silicide film in a semiconductor device.
Figure 2B:
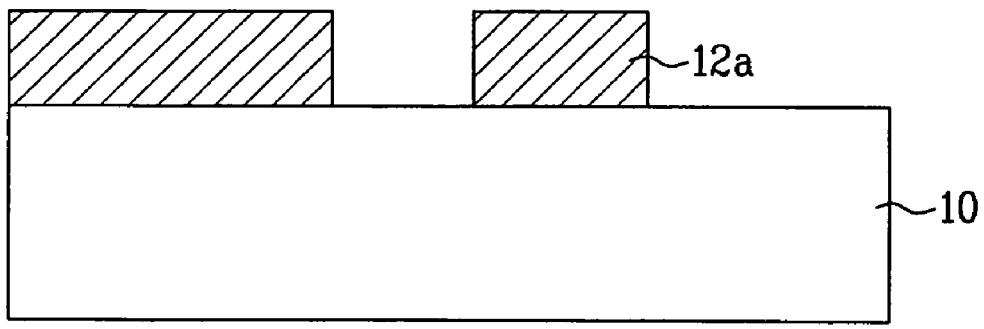
Figure 2C:
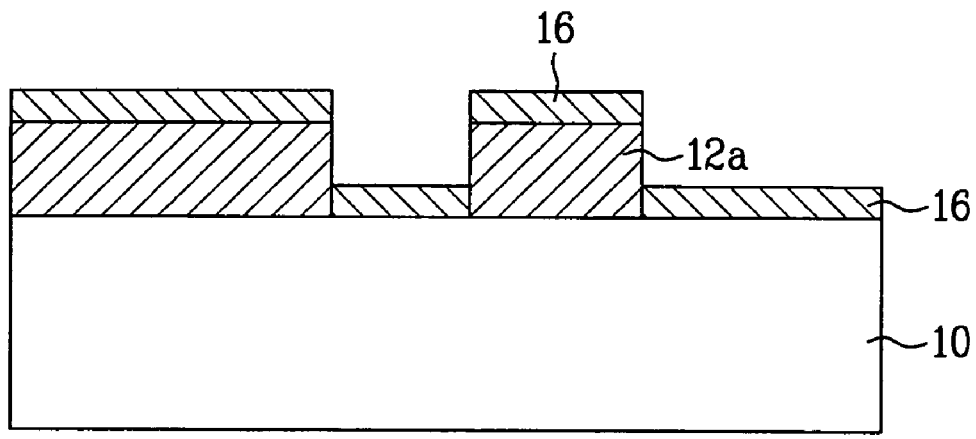
Figure 2D:
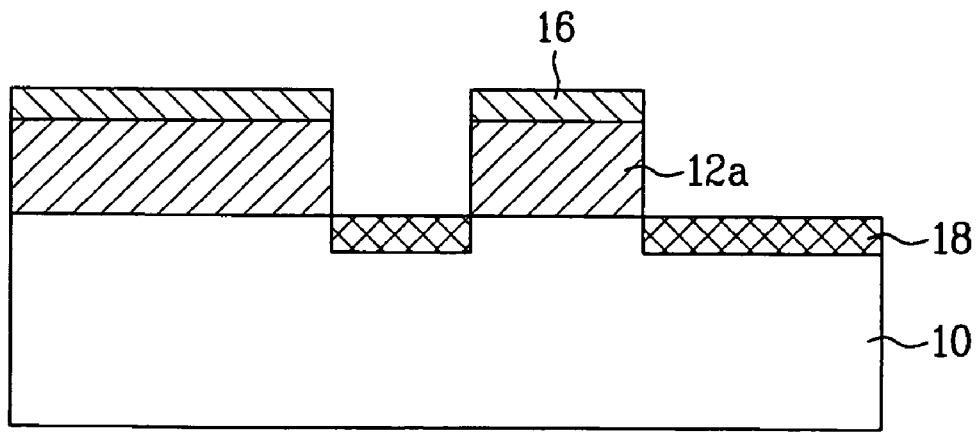
Figure 2E:
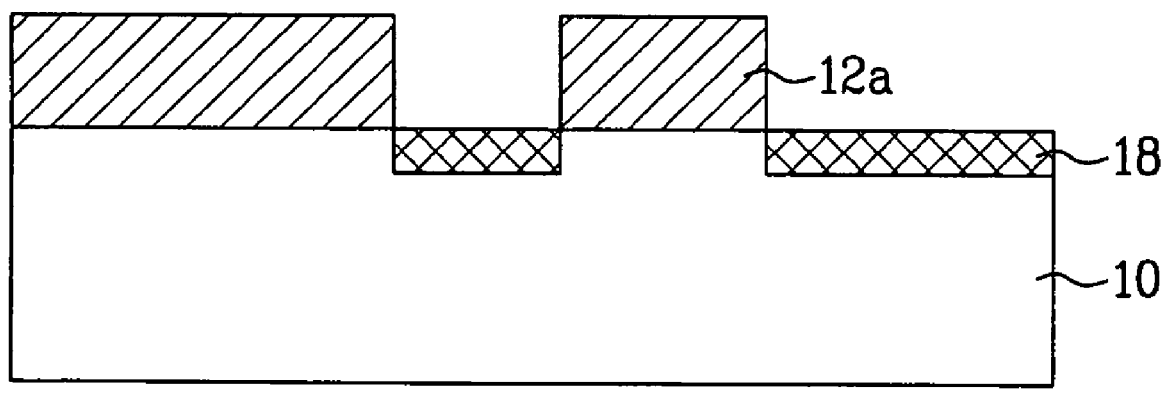
Figure 3:
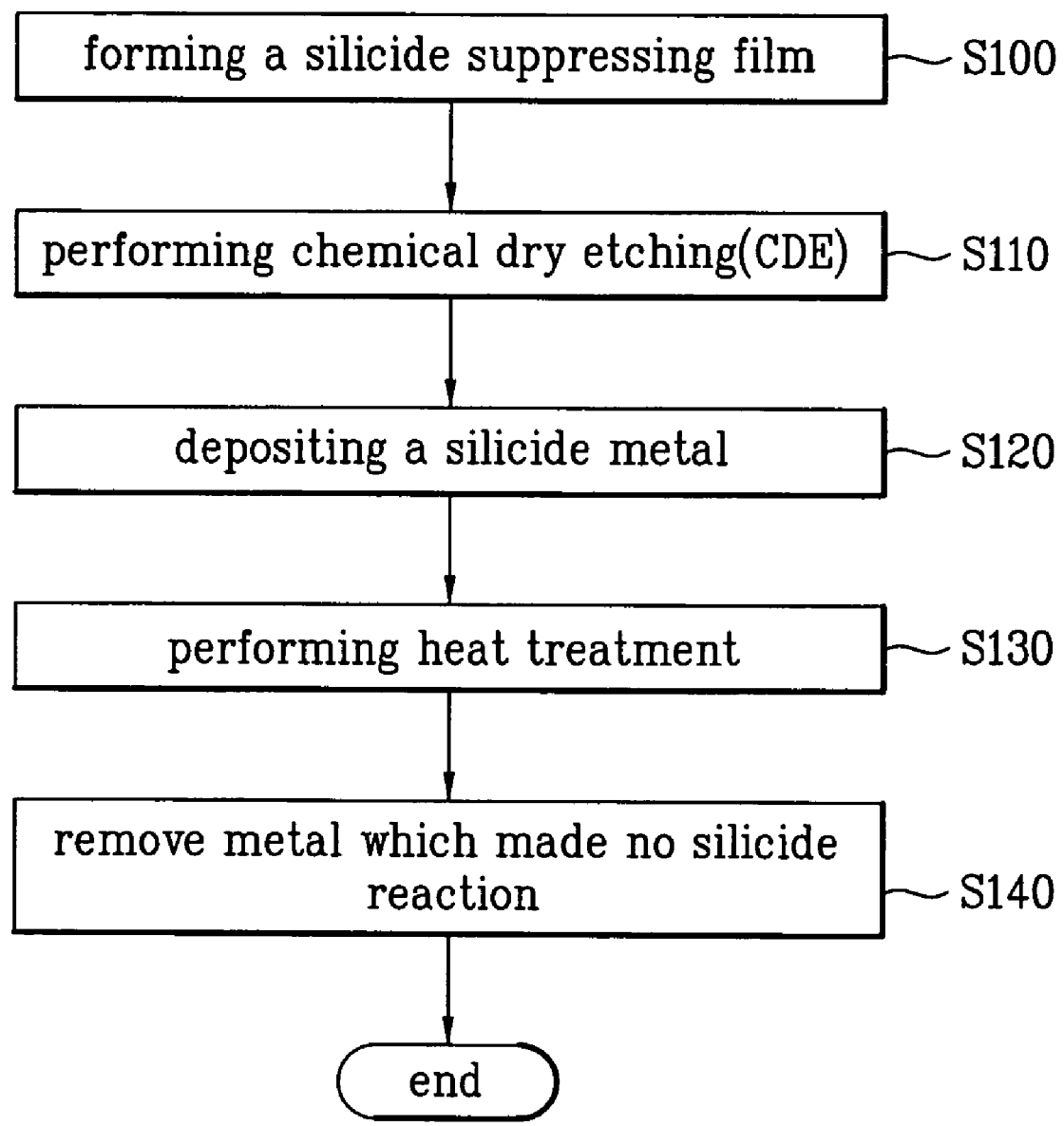
FIG. 3 illustrates a flow chart showing the steps of a method for forming a silicide film in a semiconductor device in accordance with a preferred embodiment of the present invention.

FIG. 3 illustrates a flow chart showing the steps of a method for forming a silicide film in a semiconductor device in accordance with a preferred embodiment of the present invention; and FIGS. 2A~2E illustrate sections showing the steps of a method for forming a silicide film in a semiconductor device in accordance with a preferred embodiment of the present invention.

Figure 4A:
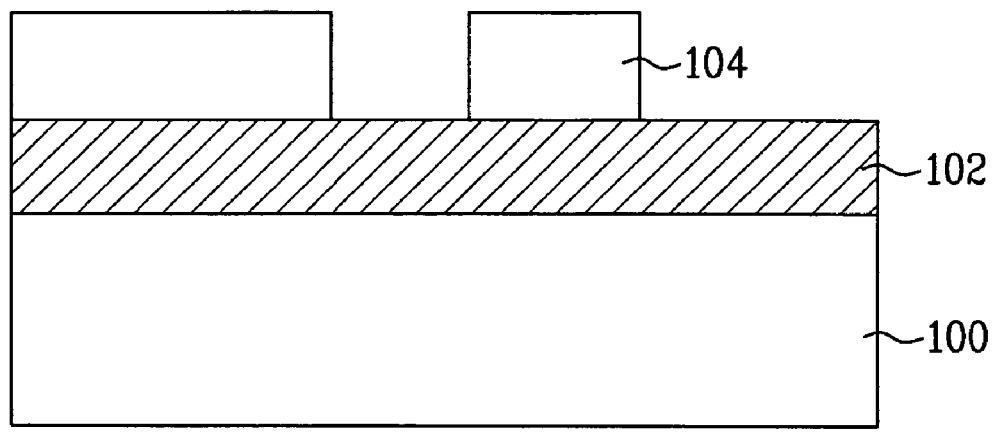
FIGS. 4A~4E illustrate sections showing the steps of a method for forming a silicide film in a semiconductor device in accordance with a preferred embodiment of the present invention.

Referring to FIG. 4A, after a semiconductor device fabricating process is performed on a silicon substrate 100 as a semiconductor substrate, a silicon oxide $SiO_2$ film, or a silicon nitride $Si_3N_4$ film is formed as a silicide suppression film 102 on the silicon substrate 100 for defining a region for forming a silicide film thereon (S100). A photo process is performed, to form a photoresist pattern 104 on the silicide suppression film 102.

Figure 4B:
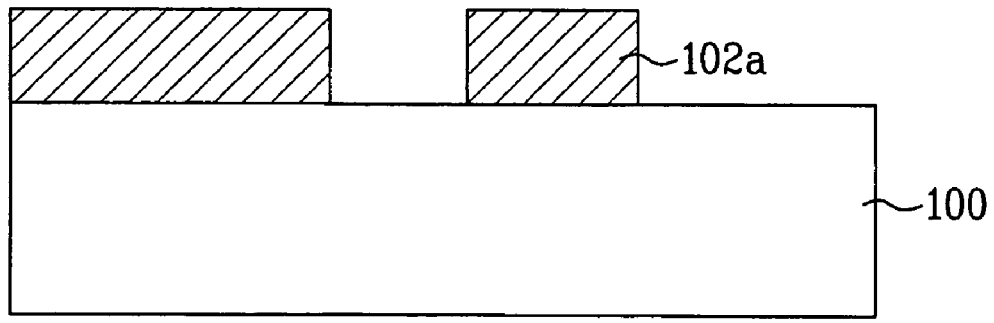

Referring to FIG. 4B, the silicide suppression film exposed from the photoresist pattern 104 is subjected to patterning by dry etching (or CDE), to form a silicide suppression film pattern 102a. The silicide suppression film pattern 102a serves to suppress a silicide reaction from occurring between the silicon substrate and a metal in a silicide forming step later (S110).

The dry etching (or CDE) is performed at a pressure of 30 Pa~40 Pa, while applying 300 W~600 W power, and supplying $CF_4$ gas at 40 sccm~100 sccm, and applying 50 W~100 W power, and supplying O2 gas at 100 sccm~300 sccm. Thus, a preferred dry etching process involves a first step using a fluorocarbon etchant (e.g., a compound of the formula $C_aH_bF_c$, where a is generally from 1 to 3, $c \geq 3$ or 4, and (b+c)=(2a+2)).

Thus, when Chemical Dry Etching (CDE) is used in formation of the silicide suppression film pattern 102a, the present invention can prevent the problems that may occur from dry etching by using plasma, or wet etching by using an etching solution in the related art. That is, since Chemical Dry Etching (CDE) has a distance between a plasma generating portion and the semiconductor substrate 100 greater than a general plasma dry etching, enough to apply no bias voltage thereto and enable only radicals in the plasma to reach to the substrate actually, of which chemical action etches the silicide suppression film pattern 102a, isotropic etching can be made. Accordingly, since reach of excited ions and the like in the plasma to the semiconductor substrate is suppressed, etch damage caused by the plasma ions may be significantly reduced.

Figure 4C:
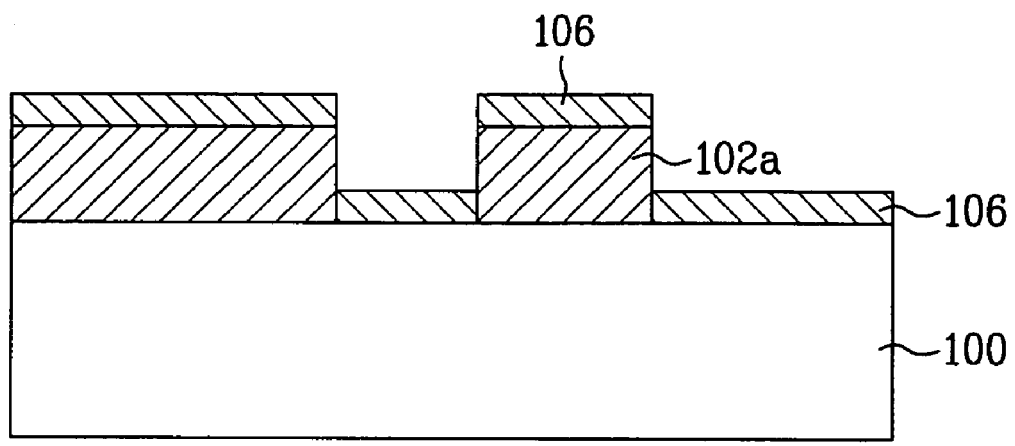

Referring to FIG. 4C, a rare earth metal film 16 of, such as tungsten W, titanium Ti, cobalt Co, or so on is deposited on surfaces of the silicide suppression pattern 102a, and the silicon substrate 100, for forming a silicide (S120).

Figure 4D:
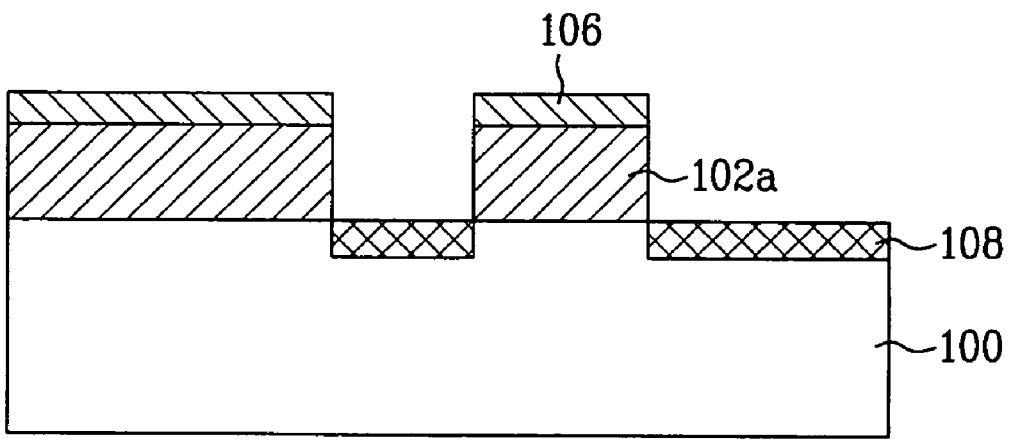
Figure 4E:
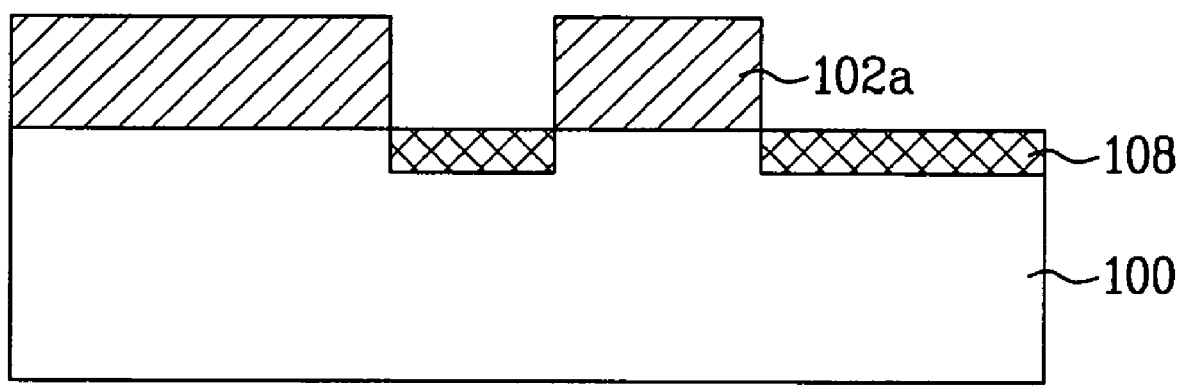

Then, referring to FIG. 4D, a heat treatment process is performed for making a silicide reaction between the metal film 106 and the silicon substrate 100, so that a silicide film 108 is formed only on a silicon substrate 100 region exposed from the silicide suppression pattern 102a, excluding the silicide suppression pattern 102a (S130). That is, since the silicon oxide film, or the silicon nitride film, or the like of the silicide suppression film pattern 102a does not make reaction with the metal film 106 well, though the silicon oxide film, or the silicon nitride film is not turned into a silicide film, since the silicon of the silicon substrate 100 makes reaction with the metal film 106 well, the silicon is turned into a silicide film. The silicide film 108 may be formed of, for example, tungsten silicide ($WSi_2$), titanium silicide ($TiSi_2$), cobalt silicide ($CoSi_2$), and so on.

Then, referring to FIG. 2E, upon removal of only the metal film 106 which is not turned into a silicide film, excluding the silicide film 108, only the silicide film 108 and the silicide suppression film pattern 102a are remained on the silicon film 100 (S140). Thereafter, the silicide suppression film pattern 102a is removed as required.

Therefore, by forming the silicide film only on a region of the semiconductor device selectively by the method for forming a silicide film of the present invention, the sheet resistance or the contact resistance of a region having the silicide film formed thereon can be dropped.

As has been described, dry etching performed in formation of the silicide suppression film pattern to form the silicide suppression film pattern by chemical action of radicals, while suppressing reach of the excited ions in the plasma to the semiconductor substrate, can reduce the etch damage caused by the plasma ions.

Accordingly, the present invention can minimize the etch damage caused by plasma ions while etching the silicide suppression film pattern accurately, thereby improving process yield of the semiconductor device. Moreover, the chemical dry etching of the present invention by using a reaction chamber having separate plasma generating room and etch room can prevent the photoresist pattern from being deformed by plasma.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming a silicide film in a semiconductor device, comprising the steps of:
    forming a silicide suppressing film on a silicon substrate;
    dry etching the silicide suppressing film by supplying $CF_4$ gas at a flow rate of from about 40 sccm to about 100 sccm at pressure of from about 30 Pa to about 40 Pa while applying a power of from about 300 W to about 600 W, and supplying O, gas at a flow rate of from about 100 sccm to about 300 sccm while applying a power of from about 50 W to about 100 W to form a silicide suppressing film pattern;
    forming a metal film on a surface of the silicon substrate inclusive of the silicide suppressing film pattern;
    heating the silicon substrate to form a silicide film on a portion of the silicon substrate exposed by the silicide suppressing film pattern; and
    removing a remaining portion of the metal film.

2. The method as claimed in claim 1, wherein the silicide suppressing film comprises a silicon oxide film or a silicon nitride film.

3. The method of claim 1, wherein no bias voltage is applied to the semiconductor substrate during the dry etching step.

4. A method for forming a silicide film in a semiconductor device, comprising the steps of:
    forming a silicide suppressing film on a silicon substrate;
    dry etching the silicide suppressing film by supplying a fluorocarbon etchant at a flow rate or from about 40 sccm to about 100 sccm at a pressure of from about 30 Pa to about 40 Pa while applying a power of from about 300 W to about 600 W, and supplying $O_2$ gas at a flow rate of from about 100 sccm to about 300 sccm while applying a power of from about 50 W to about 100 W to form a silicide suppressing film pattern;
    forming a metal film on a surface of the silicon substrate and the silicide suppressing film pattern;
    heating the silicon substrate to form a silicide film on a portion of the silicon substrate exposed by the silicide suppressing film pattern; and
    removing a remaining portion of the metal film.

5. The method of claim 4, wherein the fluorocarbon etchant comprises a compound of the formula $C_aH_bF_c$, where a is from 1 to 3, $c \geq 3$, and $(b+c)=(2a+2)$.

6. The method of claim 5, wherein $c \geq 4$.

7. The method of claim 4, wherein the silicide suppressing film comprises a silicon oxide film.

8. The method of claim 7, wherein the silicide suppressing film comprises $SiO_2$.

9. The method of claim 4, wherein the silicide suppressing film comprises a silicon nitride film.

10. The method of claim 4, further comprising forming a photoresist pattern on the suicide suppressing film prior to dry etching the silicide suppressing film.

11. The method of claim 4, further comprising removing the remaining silicide suppressing film after a remaining portion of the metal film has been removed.

12. The method of claim 4, wherein the metal film comprises a rare earth metal film.

13. The method of claim 12, wherein the rare earth metal comprises tungsten.

14. The method of claim 12, wherein the rare earth metal comprises titanium.

15. The method of claim 12, wherein the rare earth metal comprises cobalt.

16. The method of claim 12, wherein the metal film comprises a tungsten film, a titanium film, or a cobalt film.

17. The method of claim 4, wherein the silicide film comprises tungsten silicide.

18. The method of claim 4, wherein the silicide film comprises titanium silicide.

19. The method of claim 4, wherein the silicide film comprises cobalt silicide.

20. The method of claim 4, wherein no bias voltage is applied to the semiconductor substrate during the dry etching step.

* * * * *